United States Patent [19]
Ueno

[11] Patent Number: 6,021,075
[45] Date of Patent: Feb. 1, 2000

[54] SEMICONDUCTOR MEMORY CIRCUIT HAVING SHIFT REDUNDANCY CIRCUITS

[75] Inventor: Yoshinori Ueno, Kanagawa, Japan

[73] Assignee: NEC Corporation, Tokyo, Japan

[21] Appl. No.: 09/161,217

[22] Filed: Sep. 28, 1998

[30] Foreign Application Priority Data

Sep. 30, 1997 [JP] Japan ................................. 9-265591

[51] Int. Cl.[7] .................................................. G11C 7/00
[52] U.S. Cl. ..................................... 365/200; 365/225.7
[58] Field of Search .............................. 365/200, 225.7, 365/196, 230.03, 241

[56] References Cited

U.S. PATENT DOCUMENTS 5,146,429  9/1992  Kawai et al. .
5,255,217  10/1993  Tan .
5,260,902  11/1993  Pilling et al. .
5,608,685  3/1997  Johnson et al. ........................ 365/200

FOREIGN PATENT DOCUMENTS 0 434 200  6/1991  European Pat. Off. .

OTHER PUBLICATIONS

A. Ohba et al., "A 7NS 1MB BiCMOS ECL SRAM with Program–Free Redundancy", pp. 1–2, IEEE No. SYMO 4 Jun. 7, 1990.

*Primary Examiner*—David Nelms
*Assistant Examiner*—David Lam
*Attorney, Agent, or Firm*—Young & Thompson

[57] ABSTRACT

A semiconductor memory circuit comprises a plurality of shift redundancy circuits each of which is connected to two of write/read circuits and a redundancy write/read circuit. Also, a plurality of fuse elements are connected to each other in series. One of the fuse elements is connected between one of the shift redundancy circuits and a power supply potential and the others are each connected between two of the shift redundancy circuits. A program circuit is connected to one of the fuse elements disposed at an end portion opposite to the fuse element connected to the power supply potential, and selectively outputs a power supply potential or a ground potential. A plurality of cut fuse detecting circuits are provided which individually detect whether the fuse elements are cut or not, and control each of the write/read circuits and the redundancy write/read circuit in an activated or a inactivated state.

10 Claims, 4 Drawing Sheets

SEMICONDUCTOR MEMORY CIRCUIT HAVING SHIFT REDUNDANCY CIRCUITS

BACKGROUND OF THE INVENTION

1. Field of the Invention

The present invention relates to a semiconductor memory circuit, and specifically to a semiconductor memory circuit having shift redundancy circuits used for substituting a redundancy memory cell for a defective memory cell.

2. Description of the Related Art

Recently, remarkable developmen ts have been made in a semiconductor memory circuit as a result of an improved technique of forming fine semiconductor elements, and an accessing speed of writing and reading data has been increased.

However, if the access speed is accelerated as described above, especially in the case of a synchronous semiconductor memory circuit, in the conventional redundancy circuit of a redundancy memory cell substituting type, selecting speeds of the redundancy memory cell and a normal memory cell become different from each other when the redundancy memory cell is substituted for the n ormal memory cell. Therefore, there is a tendency to use a shift redundancy circuit which does not generate a difference in selecting speed of the redundancy and normal memory cells.

Figure 1:
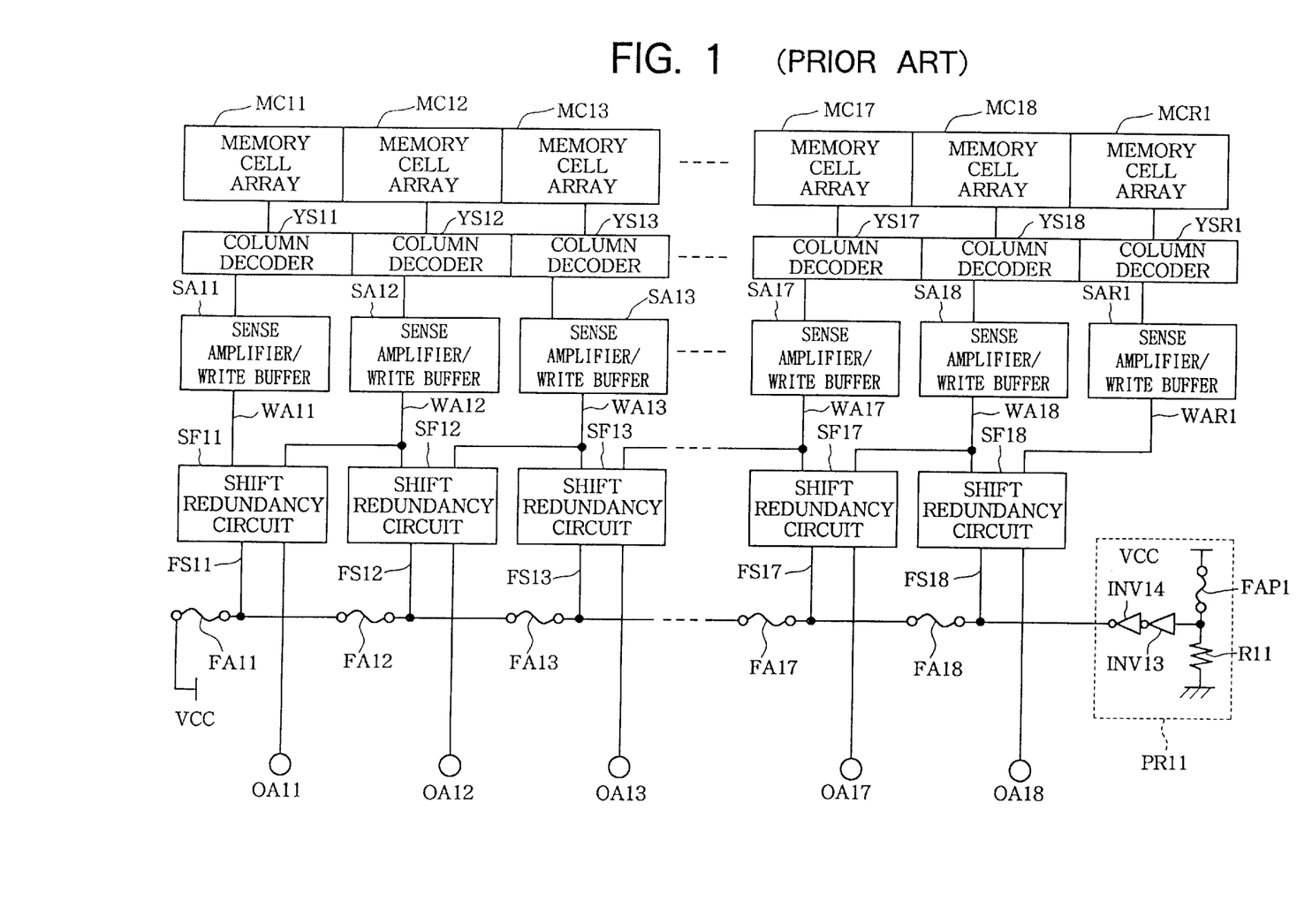
FIG. 1 is a block diagram showing a conventional semiconductor memory circuit of a redundancy memory cell substituting system having shift redundancy circuits.

FIG. 1 is a block diagram showing a conventional semiconductor memory circuit of the redundancy memory cell substituting type having the shift redundancy circuits.

Memory cell arrays MC11 to MC18 and a redundancy memory cell array MCR1 are connected to corresponding sense amplifier/write buffers SA11 to SA18 and SAR1 through corresponding column decoders YS11 to YS18 and YSR1 when the column decoders are selected.

An input/output signal line WA11 connected to the sense amplifier/write buffer SA11 and an input/output signal line WA12 connec ted to the sense amplifier/write buffer SA12 are connected to input terminals of a shift redundancy circuit SF11.

Similarly, input/output signal lines WA12 to WA18 and WAR1 respectively connected to the sense amplifier/write buffers SA12 to SA18 and SAR1 are connected to input terminals of shift redundancy circuits SF12 to SF18. Switch signal lines FS11 to FS18 to which fuse elements FA11 to FA18 on an output line of a program circuit PR11 are connected are connected to the shift redundancy circuits SF11 to SF18, and the switch signal lines FS11 to FS18 are connected to a control terminal.

In the program circuit PR11, a fuse element FAP1 and a resistance element R11 are connected to each other in series between a power supply potential VCC and a ground potential GND. A potential of a node between the fuse element FAP1 and the resistance element R11 is output to the fuse elements FA11 to FA18 through inverters INV13 and INV14.

Figure 2:
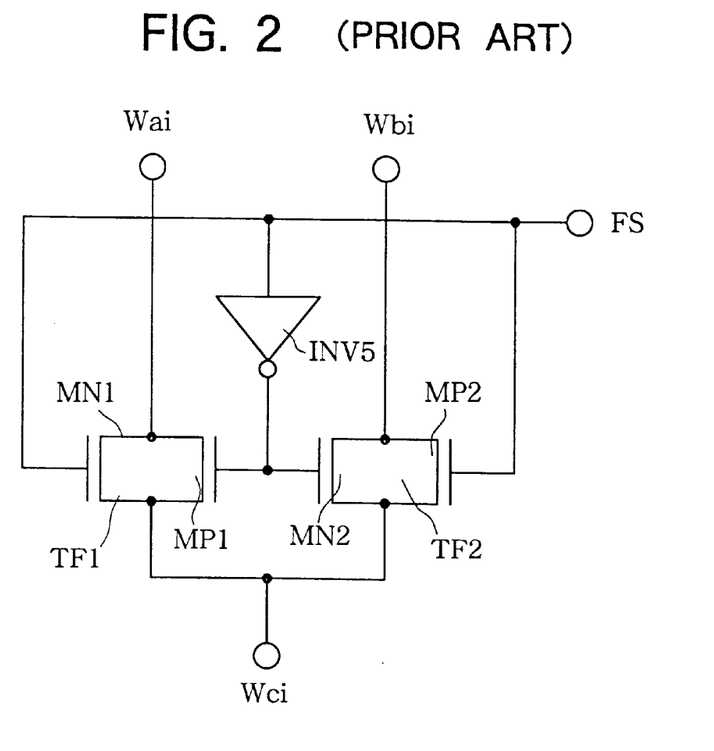
FIG. 2 is a circuit diagram showing the shift redundancy circuit.

A structure and an operation of the shift redundancy circuit will be described below. FIG. 2 is a circuit diagram showing the shift redundancy circuit.

The shift redundancy circuit is provided with a switch signal line FS to which a switch signal for the shift redundancy circuit is transmitted. An inverter INV5 and gates of an N-channel MOS transistor MN1 and a P-channel MOS transistor MP2 are connected to the switch signal line FS. The shift redundancy circuit is further provided with a P-channel MOS transistor MP1 having a source and a drain respectively connected to a source and a drain of the N-channel MOS transistor MN1 and an N-channel MOS transistor MN2 having a source and a drain connected to a source and a drain of the P-channel MOS transistor MP2. A gate of the P-channel MOS transistor MP1 is connected to a gate of the N-channel MOS transistor MN2 at a node, and the inverter INV5 is connected between the node and the switch signal line FS. Thus, the N-channel MOS transistor MN1 and the P-channel MOS transistor MP1 constitute a transfer-gate switch circuit TF1, and the N-channel MOS transistor MN2 and the P-channel MOS transistor MP2 constitute a transfer-gate switch circuit TF2.

Furthermore, an input/output signal line Wai is connected to one of the nodes connecting the sources and drains in the two MOS transistors of the switch circuit TF1, and an input/output signal line Wbi is connected to one of the nodes connecting the sources and drains of the two MOS transistors in the switch circuit TF2. A signal line Wci is connected to the other nodes of the switch circuits TF1 and TF2.

The switch signal line FS corresponds to the switch signal lines FS11 to FS18 in FIG. 1, and the input/output signal lines Wai and Wbi correspond to the input/output signal lines WA11 to WA18 and WAR1 in FIG. 1. The signal line Wci corresponds to signal lines OA11 to OA18 in FIG. 1.

The shift redundancy circuit formed in the above manner operates so that the switch circuit TF2 is turned off when the switch circuit TF1 is turned on, and the switch circuit TF2 is turned on when the switch circuit TF1 is turned off.

When the signal line FS is at a VCC level, for example, the switch circuit TF1 is turned on and the switch circuit TF2 is turned off. Then, a level of the signal line Wai is transmitted to the input/output signal line Wci.

When the signal line FS is at a GND level, on the other hand, the switch circuit TF1 is turned off and the switch circuit TF2 is turned on. Then, a level of the signal line Wbi is transmitted to the input/output signal line Wci.

An operation of the conventional semiconductor memory circuit in a case in which a defective memory cell array does not exist and the redundancy memory cell array is not substituted for a defective memory cell array by the shift redundancy circuit will be described below. In this case, a signal at a VCC level is output from the program circuit PR11 and the VCC level is transmitted to all of the signal lines FS11 to FS18. Then, a level of the input/output signal line WA11 is output to the signal line OA11 connected to the shift redundancy circuit SF11. Similarly, levels of the input/output signal lines WA12 to WA18 are respectively output to the input/output signal lines OA12 to OA18.

Next, a case in which a defective memory cell array exists for which the redundancy memory cell array is substituted will be described, supposing that the memory cell array MC15 is defective. In this case, the fuse element FAP1 in the program circuit PR11 and the fuse element FA15 are cut. As a result, a signal at a GND level is output from the program circuit PR11, and the GND level is transmitted to the switch signal lines FS15 to FS 18. Then, a level of the input/output signal line WA16 is output to the signal line OA15, a level of the input/output signal line WA17 is output to the signal line OA16, a level of the input/output line WA18 is output to the signal line OA17, and a level of the input/output signal line WAR1 is output to the signal line OA18.

On the other hand, the VCC level is transmitted to the switch signal lines FS11 to FS14, even in a state in which the fuse element FA15 is cut. Consequently, output levels of the signal lines OA11 to OA14 equal the levels of the input/output signal lines WA11 to WA14, respectively.

A level of the input/output signal line WA15 corresponding to the defective memory cell array MC15 is interrupted by the shift redundancy circuits SF14 and SF15, and is not output to any of the signal lines OA14 and OA15.

In the system of substituting the redundancy memory cell using the shift redundancy circuits SF11 to SF18 as described above, a difference is not generated between speeds of selecting the redundancy memory cell and the normal memory cell. Therefore, the redundancy memory cell substituting system is used more frequently for a high-speed semiconductor memory circuit and a synchronous semiconductor memory circuit, as compared to a normal redundancy system in which a difference exists in speeds of selecting the redundancy memory cell and the normal memory cell.

However, when the shift redundancy circuits are used, whether or not the redundancy memory cell is substituted, the signal levels are transmitted to the shift redundancy circuits SF11 to SF18 by the input/output signal lines WA11 to WA18 and WAR1, as described above. As a result, because the column decoder and the sense amplifier/write buffer corresponding to the defective memory cell array keep on operating, an operating current is increased as compared with that in a normal semiconductor memory circuit.

Therefore, a semiconductor memory circuit, which is provided with killer signal generating circuits for inactivating the column decoder and the sense amplifier/write buffer connected to the defective memory cell array, is necessary.

Figure 3:
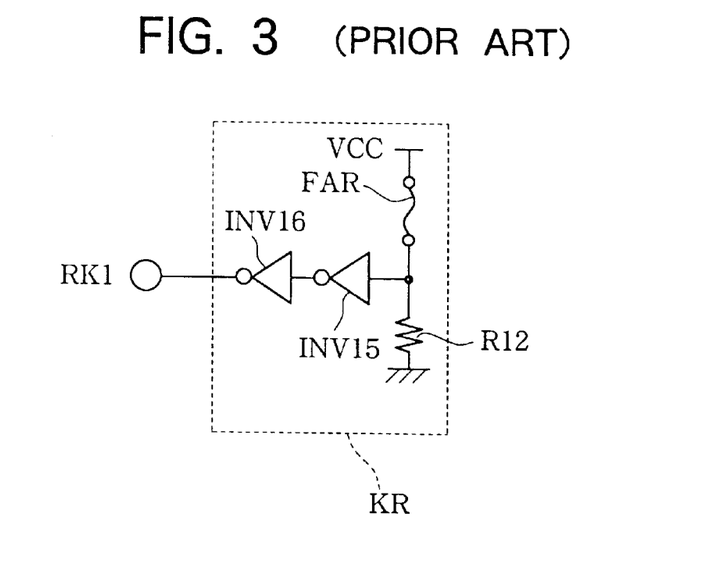
FIG. 3 is a circuit diagram showing a killer signal generating circuit.

Such a killer signal generating circuit will be described below. FIG. 3 is a circuit diagram showing the killer signal generating circuit.

In the killer signal generating circuit, a fuse element FAR and a resistance element R12 connected to each other in series are provided between a power supply potential VCC and a ground potential GND. An inverter INV15 to which another inverter INV16 is connected in series is connected to a node between the fuse element FAR and the resistance element R12. A signal line RK1 is connected to the inverter INV16.

In the killer signal generating circuit formed in the above manner, in a case in which the redundancy memory cell array is not substituted, the fuse element FAR is not cut, and the VCC level is transmitted to the signal line RK1 through the inverters INV15 and INV16. In a case in which the redundancy memory cell array is substituted, on the other hand, the fuse element FAR is cut, and the GND level is transmitted to the signal line RK1.

Figure 4:
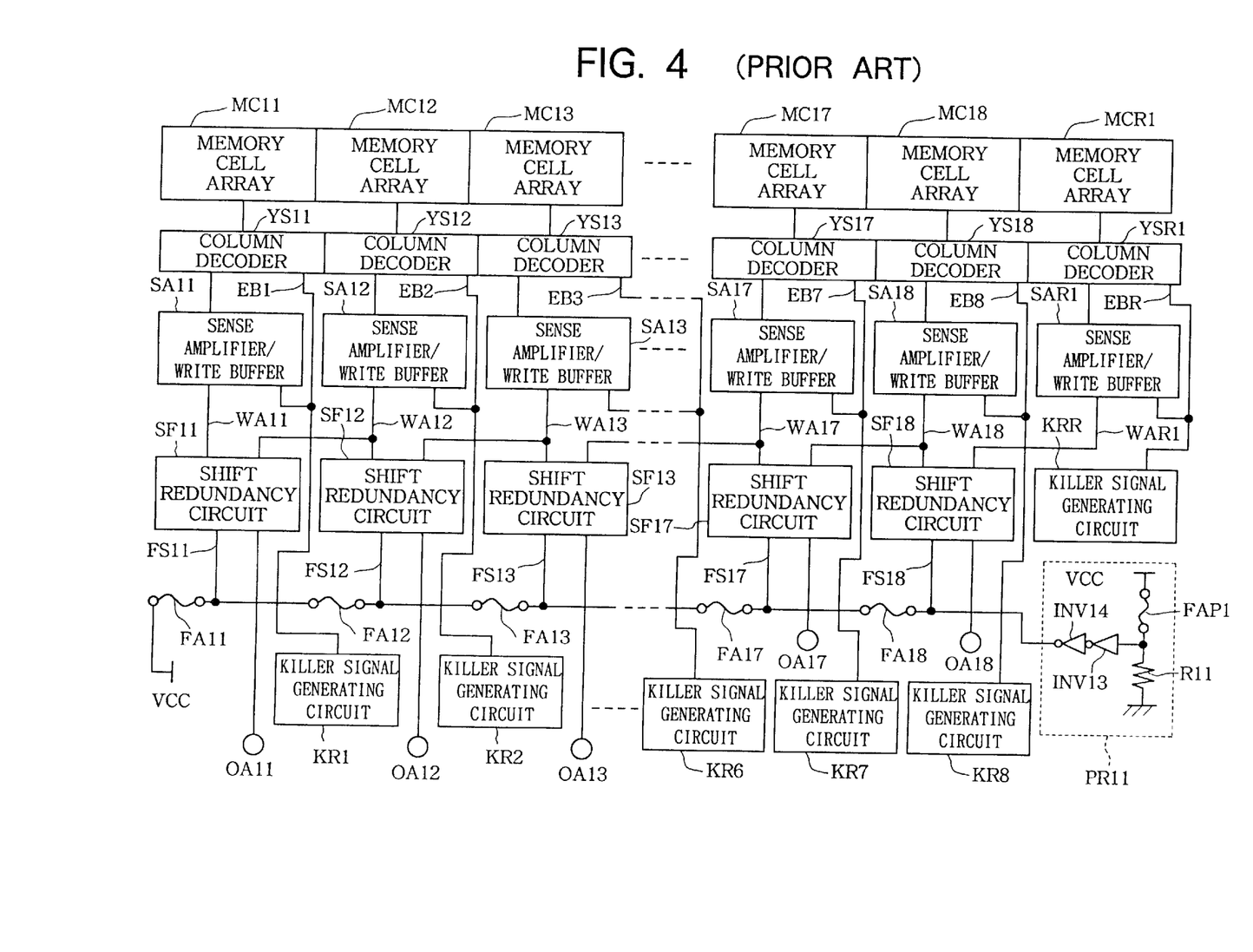
FIG. 4 is a block diagram showing a conventional semiconductor memory circuit of a redundancy memory cell substituting system having the killer signal generating circuits and the shift redundancy circuits.

FIG. 4 is a block diagram showing a conventional redundancy memory cell substituting semiconductor memory circuit having killer signal generating circuits and shift redundancy circuits. In the prior art shown in FIG. 4 (the second prior art), components similar to those in the prior art shown in FIG. 1 (the first prior art) are provided with similar reference numerals to omit detailed descriptions.

The second prior art is provided with killer signal generating circuits KR1 to KR8 and KRR for outputting killer signals EB1 to EB8 and EBR to column decoders YS11 to YS18 and YSR1 and sense amplifier/write buffers SA11 to SA18 and SAR1, respectively.

If a redundancy memory cell is not substituted, a fuse element in the killer signal generating circuit KRR is cut. As a result, the killer signal EBR acquires the GND level, and the column decoder YSR1 and the sense amplifier/write buffer SAR1 are inactivated.

On the other hand, fuse elements in the killer signal generating circuits KR1 to KR8 are not cut. For this reason, the killer signals EB1 to EB8 acquire the VCC level, and the column decoders YS11 to YS18 and the sense amplifier/write buffers SA11 to SA18 are not inactivated.

Next, a case in which a redundancy memory cell is substituted will be described. In a case in which a memory cell array MC15 is defective, for example, the fuse element in the killer signal generating circuit KR5 is cut. As a result, because the killer signal EB5 acquires the GND level, the column decoder YS15 and the sense amplifier/write buffer SA15 are inactivated.

In this manner, in the second prior art, the killer signal generating circuits KR1 to KR8 and KRR are necessary to completely inactivate one of the column decoders YS11 to YS18 and YSR1, and one of the sense amplifier/write buffers SA11 to SA18 and SAR1 based on whether or not the defective memory cell array exists. The technique of forming a finer semiconductor memory circuit has been improved recently, as described above, and transistors constituting an internal circuit has been made finer, but fuse elements are scarcely made finer. Therefore, according to the second prior art which includes large number of fuse elements in the killer signal generating circuits KR1 to KR8 and KRR, the size of a chip increases.

In other words, in the second prior art in which the operating current can be decreased, the fuse elements in the killer signal generating circuits can not be disposed in a layer below the signal lines and the like, but require exclusive spaces. In a case in which the size of the chip is approximately 25 mm$^2$, the size of the chip increases by about 10%.

In a case in which diffusion is conducted in a wafer of a 6-inch size, for example, if the killer signal generating circuit is not provided, a number of available pellets is 600 in a chip of 25 mm$^2$, while the number of available pellets decreases by 60 per a wafer and becomes 540 in a chip of about 27.5 mm$^2$, if the killer signal generating circuits are provided.

As described above, in the first prior art in which the shift redundancy circuits are used for substituting the redundancy memory cell, the operating current increases considerably, because all the column decoder and sense amplifier/write buffer circuits having the circuits which are not used operate.

The second prior art having the killer signal generating circuits for decreasing the operating current, on the other hand, suffers from a problem of an increased size of the chip.

SUMMARY OF THE INVENTION

It is an object of the present invention to provide a semiconductor memory circuit in which a size of a chip is not increased even in a case in which shift redundancy circuits are used for substituting a redundancy memory cell array, and an operating current can be decreased.

According to the present invention, a semiconductor memory circuit having shift redundancy circuits comprises a plurality of memory cell arrays, a redundancy memory cell array to be substituted, when any one of the memory cell arrays is defective, for the defective memory cell array, a plurality of write/read circuits for writing and reading data to and from the memory cell arrays, a redundancy write/read circuit for writing and reading data to and from the redundancy memory cell array, a plurality of shift redundancy circuits each connected to two of the write/read circuits and the redundancy write/read circuit. The shift redundancy circuit each allows one of signals output from the two circuits to pass through. The semiconductor memory circuit comprises a plurality of fuse elements connected to each other in series. One of the fuse elements is connected between one of the shift redundancy circuits and a power supply potential, and the others of the fuse elements are respectively connected between two of the shift redundancy circuits. Furthermore, the semiconductor memory circuit comprises a program circuit connected to one of the fuse elements disposed at an end portion opposite to the fuse element connected to the power supply potential and a plurality of cut fuse detecting circuits. The program circuit selectively outputs a power supply potential or a ground potential. The cut fuse detecting circuit each detects individually whether each of the fuse elements is cut or not and controls each of the write/read circuit and the redundancy write/read circuit in an activated state or a inactivated state, based on a result of the detection.

Because the present invention is provided with the cut fuse detecting circuits for individually detecting whether the fuse elements are cut or not and for controlling each of the write/read circuits and the redundancy write/read circuit in the activated state or the inactivated state, according to the result of the detection, the write/read circuit allocated to the defective memory cell array can be brought into the inactivated state. In this manner, an operating current can be decreased.

Also, because the cut fuse detecting circuits can be formed without using fuse elements and can be disposed in a layer below the signal lines, increase in size of the chip can be prevented. Therefore, it is possible to prevent decrease in a number of available pellets per a wafer.

DETAILED DESCRIPTION OF THE PREFERRED EMBODIMENT

Figure 5:
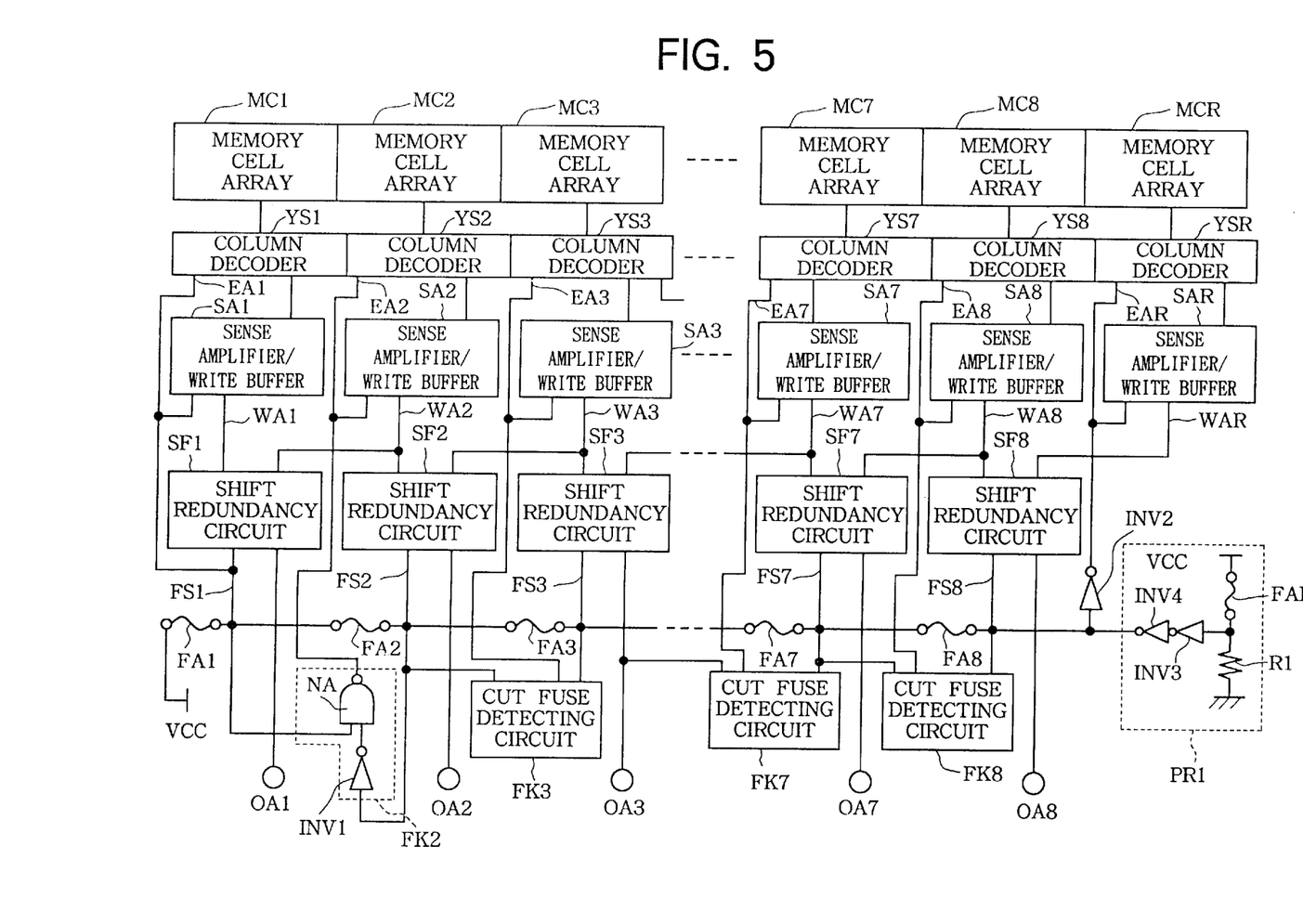
FIG. 5 is a block diagram showing an embodiment of a semiconductor memory circuit according to the present invention.

An embodiment of a semiconductor memory circuit according to the present invention will be specifically described below with reference to accompanying drawings. FIG. 5 is a block diagram showing the embodiment of the semiconductor memory circuit of the present invention.

The present embodiment is provided with eight memory cell arrays MC1 to MC8 and a redundancy memory cell array MCR. The embodiment is further provided with column decoders YS1 to YS8 and a redundancy column decoder YSR respectively connected to pairs of bit lines (not shown) of the memory cell arrays MC1 to MC8 and the redundancy memory cell array MCR. Furthermore, sense amplifier/write buffers SA1 to SA8 and a redundancy sense amplifier/write buffer SAR are respectively connected to the column decoders YS1 to YS8 and the redundancy column decoder for inputting written data and amplifying read data. Input/output signal lines WA1 to WA8 and a redundancy input/output signal line WAR are respectively connected to the sense amplifier/write buffers SA1 to SA8 and the redundancy sense amplifier/write buffer SAR.

A shift redundancy circuit SF1 is connected to the input/output signal lines WA1 and WA2, a shift redundancy circuit SF2 is connected to the input/output signal lines WA2 and WA3, and shift redundancy circuits SF3 to SF7 are similarly connected to the input/output signal lines WA3 to WA8. Further, a shift redundancy circuit SF8 is connected to the input/output signal line WA8 and the redundancy input/output signal line WAR. Signals output from the shift redundancy circuits SF1 to SF8 are respectively transmitted to the signal lines OA1 to OA8.

The shift redundancy circuit SF1 alternatively selects one of signals output from the sense amplifier/write buffers SA1 and SA2 as a control signal and outputs the result to the signal line OA1. Similarly, the shift redundancy circuits SF2 to SF8 output selection results to the signal lines OA2 to OA8. Switch signal lines FS1 to FS8 are connected to the shift redundancy circuits SF1 to SF8. A fuse element FA1 is provided between the switch signal line FS1 and a power supply potential VCC. A fuse element FA2 is provided between the switch signal line FS1 and the switch signal line FS2. Similarly to the fuse element FA2, fuse elements FA3 to FA8 are provided between two of the switch signal lines FS2 to FS8.

Furthermore, the present embodiment is provided with a program circuit PR1 having a switch fuse element FAP and a resistance element R1 connected in series to each other between a power supply potential VCC and a ground potential GND. In the program circuit PR1, an inverter INV3 is connected to a node between the switch fuse element FAP and the resistance element R1, and another inverter INV4 is connected to the inverter INV3 in series. The inverter INV4 is connected to the switch signal line FS8.

Also a cut fuse detecting circuit FK2 is provided which has two input terminals into which potentials of opposite terminals of the fuse element FA2 are input. The cut fuse detecting circuit FK2 comprises a NAND circuit NA and an inverter circuit INV1 connected to one of input terminals of the NAND circuit NA. A potential of a node between the fuse element FA1 and the fuse element FA2 is input into the other input terminal of the NAND circuit NA. A potential of a node between the fuse element FA2 and the fuse element FA3 is input into the inverter INV1. Similarly to the cut fuse detecting circuit FK2, potentials of opposite terminals of each of the fuse elements FA3 to FA8 are input into two input terminals of each of the cut fuse detecting circuits FK3 to FK8. In other words, the potential of the corresponding fuse element on the side of the program circuit PR1 is input into the input terminal of the cut fuse detecting circuit provided with the inverter, while the potential of the corresponding fuse element on the side of the power supply potential VCC is input into the input terminal of the cut fuse detecting circuit which is not provided with the inverter.

The potential of the node between the fuse element FA1 and the fuse element FA2 functioning as a killer signal EA1 controls an activated/inactivated state of the column decoder YS1 and the sense amplifier/write buffer SA1 constituting a write/read circuit. Killer signals EA2 to EA8 output from the cut fuse detecting circuits FK2 to FK8 control activated/inactivated states of the column decoders YS2 to YS8 and the sense amplifier/write buffers SA2 to SA8 constituting write/read circuits.

An inverter INV2 is connected among the program circuit PR1 and the redundancy column decoder YSR, and the redundancy sense amplifier/write buffer SAR. A signal output from the program circuit PR1 and inverted by the inverter INV2 controls an activated/inactivated state of the redundancy column decoder YSR and the redundancy sense amplifier/write buffer SAR constituting a redundancy write/read circuit.

Some repeated portions are omitted in FIG. 5 to make the drawing less complicated. The components can be repeated, if necessary.

For better understanding, an operation of the present embodiment having the above structure will be schematically described.

In a case in which one of the memory cell arrays MC1 to MC8 is defective and the redundancy memory cell array MCR is to be substituted for the defective memory cell array, one of the fuse elements FA1 to FA8 corresponding to the defective memory cell array and the switch fuse element FAP in the program circuit PR1 are cut. When the switch fuse element FAP in the program circuit PR1 is cut, a signal at a GND level is output from the program circuit PR1, and the GND level is transmitted to one terminal of the fuse element cut corresponding to the defective memory cell array. On the other hand, a VCC level is transmitted from the power supply potential VCC to the other terminal of the cut fuse element and to the fuse elements between the cut fuse and the power supply potential VCC.

Therefore, the different potentials, i.e., the VCC level and the GND level are respectively transmitted to the opposite terminals of the cut fuse elements, while the same potential is transmitted to the opposite terminals of the fuse elements which are not cut.

Input ends of the cut fuse detecting circuits FK1 to FK8 are connected to the opposite ends of the fuse elements FA2 to FA8 (switch signal lines FS2 to FS8). If different potentials are input respectively into the opposite terminals of the corresponding fuse element, the corresponding column decoder and sense amplifier/write buffer are inactivated by the cut fuse detecting circuit. If the same potential are input respectively into the opposite terminals of the corresponding fuse element, the corresponding column decoder and sense amplifier/write buffer are activated by a signal output from the cut fuse detecting circuit. Thus, an operating current can be decreased by inactivating the circuits corresponding to the defective one of the memory cell arrays MC1 to MC8.

Next, the operation of the present embodiment will be specifically described.

As described above, the switch signal lines FS1 and FS2 are connected to the input terminals of the cut fuse detecting circuit FK2. If both of the switch signal lines FS1 and FS2 are at the VCC level, a killer signal EA2 at the VCC level is output from the cut fuse detecting circuit FK2, because one of the input terminals of the NAND circuit NA (an output from the inverter INV1) acquires the GND level. Also in a case in which both of the switch signal lines FS1 and FS2 are at the GND level, the killer signal EA2 acquires the VCC level.

On the other hand, if the switch signal line FS1 is at the VCC level and the switch signal line FS2 is at the GND level, the killer signal EA2 acquires the GND level.

Similarly to the cut fuse detecting circuit FK2, when potentials of both of the signal lines of the fuse element corresponding to the cut fuse detecting circuits FK3 to FK8 are at the VCC level or the GND level, the killer signals EA3 to EA8 are at the VCC level. When one of the signal lines of the fuse element corresponding to each of the cut fuse detecting circuits FK3 to FK8 is at the GND level and the other is at the VCC level, each of the killer signals EA3 to EA8 acquires the GND level.

Next, an operation in a case in which a defective memory cell array does not exist and the redundancy memory cell array is not substituted for any of the memory cell arrays will be described. In the case in which the redundancy memory cell array is not substituted, all switch signal lines FS1 to FS8 are at the VCC level, because the switch fuse element FAP is not cut in the program circuit PR1.

In this case, a signal at the VCC level is output from the program circuit PR1. Because the inverter INV2 is connected between the redundancy column decoder YSR and the redundancy sense amplifier/write buffer SAR for the redundancy memory cell and the program circuit PR1, the killer signal EAR at the GND level is transmitted to the redundancy column decoder YSR and the redundancy sense amplifier/write buffer SAR. The redundancy column decoder YSR and the redundancy sense amplifier/write buffer SAR for the redundancy memory cell are inactivated, thereby decreasing the operating current.

On the other hand, because the switch signal lines FS1 to FS8 to which signals input into the cut fuse detecting circuits FK2 to FK8 are transmitted are at the VCC level, the killer signals EA2 to EA8 are at the VCC level. At this time, the column decoders YS2 to YS8 and the sense amplifier/write buffers SA2 to SA8 are activated.

Since the killer signal EA1 acquires the VCC level which is the same as the level of the switch signal line FS1, the column decoder YS1 and the sense amplifier/write buffer SA1 are also activated.

Next, a case in which a defective memory cell array exists, for which the redundancy memory cell array is substituted will be described, supposing that the memory cell array 5 is defective. In this case, the switch fuse element FAP in the program circuit PR1 and the fuse element FA5 are cut. As a result, the program circuit PR1 outputs a signal at the GND level, and the GND level is transmitted to the switch signal lines FS5 to FS8. To the switch signal lines FS1 to FS4, on the other hand, the VCC level is transmitted.

At this time, in the cut fuse detecting circuit FK5, the switch signal line FS4 which is one input line of the cut fuse detecting circuit FK5 is at the VCC level, while the switch signal line FS5 which is the other input line is at the GND level. Because the killer signal EA5 output from the cut fuse detecting circuit FK5 is at the GND level, the column decoder YS5 and the sense amplifier/write buffer SA5 are inactivated, thereby decreasing the operating current.

On the other hand, the switch signal lines FS1 to FS4 which are the input lines of the cut fuse detecting circuits FK2 to FK4 are at the VCC level. Therefore, the killer signals EA2 to EA4 acquire the VCC level and the column decoders YS2 to YS4 and the sense amplifier/write buffers SA2 to SA4 are activated.

Since the killer signal EA1 is at the VCC level similarly to the switch signal line FS1, the column decoder YS1 and the sense amplifier/write buffer SA1 are activated.

Further, because the GND level is input into the cut fuse detecting circuits FK6 to FK8, the killer signals EA6 to EA8 acquire the VCC level. Consequently, the column decoders YS6 to YS8 and the sense amplifier/write buffers SA6 to SA8 are activated.

Moreover, since the signal at the GND level output from the program circuit PR1 is input into the inverter INV2 and is inverted, the killer signal EAR corresponding to the redundancy memory cell array MCR acquires the VCC level. As a result, the redundancy column decoder YSR and the redundancy sense amplifier/write buffer SAR for the redundancy memory cell are activated.

Next, an operation in a case in which the memory cell array MC1 is defective will be described. In this case, the switch fuse element FAP in the program circuit PR1 and the fuse element FA1 are cut. As a result, an output signal from the program circuit PR1 is at the GND level, and all the switch signal lines FS1 to FS8 acquire the GND level.

At this time, signals at the GND level are input into both of the input terminals of the cut fuse detecting circuits FK2 to FK8, and the killer signals EA2 to EA8 acquire the VCC level. Consequently, the column decoders YS2 to YS8 and the sense amplifier/write buffers SA2 to SA8 are activated.

Because the signal at the GND level output from the program circuit PR1 is input into the inverter INV2 and inverted, the killer signal EAR corresponding to the redundancy memory cell array MCR acquires the VCC level. Therefore, the redundancy column decoder YSR and the redundancy sense amplifier/write buffer SAR for the redundancy memory cell are activated.

On the other hand, because the killer signal EA1 is at the GND level similarly to the switch signal line FS1, the column decoder YS1 and the sense amplifier/write buffer SA1 are inactivated, thereby decreasing the operating current.

In this manner, the present embodiment is provided with the cut fuse detecting circuits FK2 to FK8 for detecting whether or not the fuse elements FA1 to FA8 for shift redundancy treatment are cut, and generating the killer signals EA1 to EA8 and EAR according to the detection results, thereby decreasing the operating current without increasing the size of the chip.

The structure of the cut fuse detecting circuit is not limited to the circuit having the NAND circuit and the inverter circuit connected to each other. The cut fuse detecting circuit may be composed of any logic circuits which can detect a difference between the potentials of the opposite terminals of the cut fuse connected to the shift redundancy circuit.

According to the first prior art, nine sets of column decoders and sense amplifier/write buffers operate to transmit the level of the input/output signal lines to the shift redundancy circuits, whether or not the redundancy memory cell array is substituted. As a result, the operating current of the entire circuit is "9i" ampere, supposing that the operating current of a set of the column decoder and the sense amplifier/write buffer is "i" ampere.

In contrast, according to the present embodiment, the operating current is "8i" ampere, which is 15% less than that of the first prior art.

Furthermore, the cut fuse detecting circuits can be formed without using the fuse elements and can be disposed in a layer below the respective signal lines, thereby preventing an increase of the chip size. Therefore, it is possible to prevent a decrease in the number of the available pellets per a wafer.

What is claimed is:

1. A semiconductor memory circuit having shift redundancy circuits comprises:
   a plurality of memory cell arrays;
   a redundancy memory cell array to be substituted, when any one of said memory cell arrays is defective, for said defective memory cell array;
   a plurality of write/read circuits for writing and reading data to and from said memory cell arrays;
   a redundancy write/read circuit for writing and reading data to and from said redundancy memory cell array;
   a plurality of shift redundancy circuits each connected to two of said write/read circuits and said redundancy write/read circuit, said shift redundancy circuits allowing one of signals output from said two circuits to pass through;
   a plurality of fuse elements connected to each other in series, one of said fuse elements being connected between one of said shift redundancy circuits and a power supply potential, and the others of said fuse elements being respectively connected between two of said shift redundancy circuits;
   a program circuit connected to one of said fuse elements disposed at an end portion opposite to said fuse element connected to said power supply potential, said program circuit selectively outputting a power supply potential or a ground potential; and
   a plurality of cut fuse detecting circuits for individually detecting whether said fuse elements are cut or not and for controlling each of said write/read circuits and said redundancy write/read circuit in an activated state or an inactivated state, based on a result of the detection.

2. A semiconductor memory circuit according to claim 1, wherein
   said write/read circuits each comprises:
      a column decoder connected to one of said memory cell arrays; and
      a sense amplifier/write buffer connected to said column decoder, and
   said redundancy write/read circuit comprises:
      a redundancy column decoder connected to said redundancy memory cell array; and
      a redundancy sense amplifier/write buffer connected to said redundancy column decoder.

3. A semiconductor memory circuit according to claim 1, wherein said program circuit comprises a switch fuse element connected between a power supply potential and a ground potential and selectively outputs said power supply potential or said ground potential according to whether said switch fuse element is cut or not.

4. A semiconductor memory circuit according to claim 1, wherein said cut fuse detecting circuits are connected to opposite terminals of said fuse elements and detect whether said fuse elements are cut or not, according to a difference between potentials of said opposite terminals of said fuse elements.

5. A semiconductor memory circuit according to claim 1, which further comprising signal lines for connecting said shift redundancy circuit and said cut fuse detecting circuits, said cut fuse detecting circuits being formed in a layer lower than a layer in which said signal lines are formed.

6. A semiconductor memory circuit according to claim 1, wherein said cut fuse detecting circuits each comprises:
   an inverter connected to a terminal of said fuse element on a side of said program circuit, and
   a logic circuit to which a potential of a terminal of said fuse element on a side of said power supply potential and a potential output from said inverter are input.

7. A semiconductor memory circuit according to claim 1, wherein said cut fuse detecting circuits are respectively connected to a second and succeeding ones of said fuse elements from said power supply potential.

8. A semiconductor memory circuit according to claim 1, wherein said cut fuse detecting circuits interrupt a power current of said write/read circuit to which a cut one of said fuse elements is allocated.

9. A semiconductor memory circuit according to claim 3, wherein said program circuit comprises:
- a resistor connected between said switch fuse element and said ground potential;
- a first inverter connected to a node connecting said switch fuse element and said resistor; and
- a second inverter connected to said first inverter in series.

10. A semiconductor memory circuit according to claim 1, wherein said shift redundancy circuits each comprises:

- a first switch circuit which is conducting when said fuse element allocated to said shift redundancy circuit is cut and is non-conducting when said fuse element is not cut; and
- a second switch circuit which is non-conducting when said fuse element allocated to said shift redundancy circuit is cut and is conducting when said fuse element is not cut.

* * * * *